US005309120A

United States Patent [19]

Koontz

[11] Patent Number: 5,309,120

[45] Date of Patent: May 3, 1994

[54] RF HIGH POWER, HIGH FREQUENCY, NON-INTEGER TURNS RATIO BANDPASS AUTO-TRANSFORMER AND METHOD

[75] Inventor: Floyd A. Koontz, Holcomb, N.Y.

[73] Assignee: Harris Corporation, Melbourne, Fla.

[21] Appl. No.: 981,119

[22] Filed: Nov. 24, 1992

[51] Int. Cl.[5] .............................................. H03H 7/38

[52] U.S. Cl. ...................................... 333/32; 333/177; 336/195

[58] Field of Search ............... 333/32, 176, 177, 24 R, 333/11; 336/195

[56] References Cited

U.S. PATENT DOCUMENTS

| | | | |
|---|---|---|---|
| 3,260,977 | 7/1966 | Coltman | 336/181 |
| 3,544,922 | 4/1969 | McConnell | 333/17 |
| 4,363,009 | 12/1982 | Malcolm et al. | 333/177 |
| 4,453,145 | 6/1984 | Schuster | 333/174 |
| 4,839,616 | 6/1989 | Herzog | 383/32 |

*Primary Examiner*—Benny Lee
*Assistant Examiner*—Darius Gambino
*Attorney, Agent, or Firm*—Rogers & Killeen

[57] ABSTRACT

A high power, high frequency auto transformer with a non-integer turns ratio and a bandpass filter frequency response.

22 Claims, 2 Drawing Sheets

RF HIGH POWER, HIGH FREQUENCY, NON-INTEGER TURNS RATIO BANDPASS AUTO-TRANSFORMER AND METHOD

BACKGROUND OF THE INVENTION

The present invention relates generally to a high power, high frequency transformer, and more particularly to a transformer with a non-integer turns ratio.

There is a need for non-integer turns ratio transformers, particularly in impedance matching and even more particularly in combiners where a $\sqrt{3}$ or $\sqrt{5}$ turns ratio is desired. Such non-integer turns ratio transformers are generally difficult to physically construct, often requiring numerous manufacturing steps difficult to automate.

There is also a need for a defined pass band over a specific frequency range, a need generally satisfied by a filter following the transformer. Improved efficiency results from combining the transformer and filter functions in a single unit.

In addition, there are many environments where vibration presents structural problems, particularly for magnetic cored, liquid cooled transformers.

These and other problems occur, by way of example, in modern shipboard solid state radio transmitters where transformers may be used to construct combiners for summing the power of two or more radio frequency sources to a single antenna. Because it has desirable magnetic characteristics, i.e., low reluctance, ferrite is typically used for the core of such transformers, generally as a toroid or a block with holes for the windings drilled therein. For high power (1 to 100 kw) applications, however, ferrite cores reach sufficient magnetic flux that the application of a linear current to the primary winding will not result in a linear magnetic induction without prohibitive amounts of ferrite making the transformer unacceptably expensive, bulky, heavy and susceptible to vibration damage.

Where non-integer turn ratios are desired, e.g., 1.73 ($\sqrt{3}$) and 2.24 ($\sqrt{5}$), multi-filar windings on ferrite cores have been used, but are structurally complicated and therefore difficult and expensive to build.

Furthermore, the use of ferrite for high power applications, produces severe eddy current and hysteresis losses reflected by heat dissipation in the transformer core. Such losses limit maximum transformer power, and may require elaborate and potentially hazardous cooling systems to offset the temperature rise of the ferrite. These problems are particularly severe in shipboard environments which are sensitive to both size and weight considerations, where the available electric power is limited, and where a cored transformer and its liquid cooling systems are highly susceptible to shock and vibration.

It is accordingly an object of the present invention to obviate many of the above problems of the known prior art and to provide a novel high power, high frequency transformer.

Another object of the present invention is to provide a novel high power, high frequency transformer that is simple in construction, light in weight and low in cost.

Still another object is to provide a novel high power, high frequency transformer with significantly improved resistance to shock and vibration.

Yet another object of the present invention is to provide a novel high power, high frequency transformer with a non-integer turns ratio.

A further object of the present invention is to provide a novel transformer having significant harmonic and intermodulation product suppression.

Another object of the present invention is to provide a novel high frequency, high power transformer that has bandpass characteristic that is substantially independent of temperature at normal operating ranges.

Yet still another object of the present invention is to provide a novel method of transforming impedance by a non-integer factor.

It is still a further objective to obtain a novel transformer having a bandwidth ratio up to 5:1.

These and many other objects and advantages of the present invention will be readily apparent to one skilled in the art to which this invention pertains from the claims and from the following detailed description of preferred embodiments when read in conjunction with the appended drawings.

A DESCRIPTION OF PREFERRED EMBODIMENTS

Figure 1:
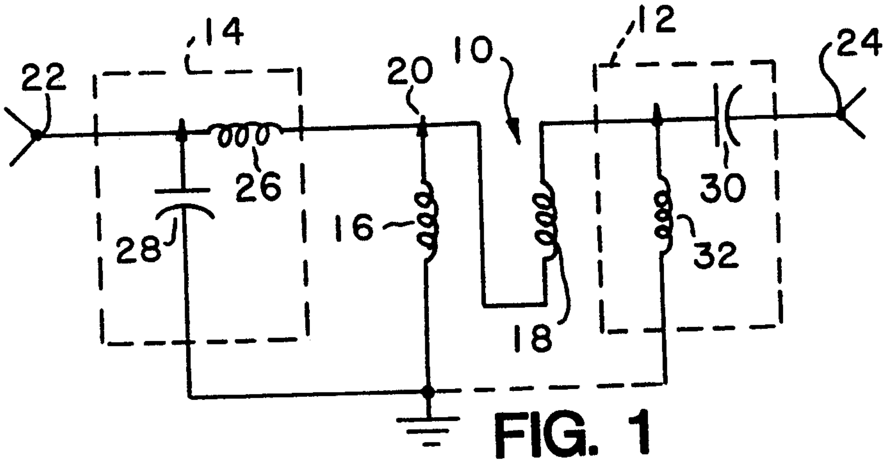
FIG. 1 is a schematic circuit diagram of one embodiment of the present invention.

With reference to the schematic of FIG. 1, a high frequency, high power, bandpass, non-integer turns ratio auto-transformer of the present invention comprises an integer turns ratio auto-transformer 10 and two sections 12, 14 of a tuning network.

The two windings 16, 18 of the transformer 10 are closely coupled and are joined together at one end in a common tap 20 to create an auto-transformer. The tap 20 is connected through the section 14 of the tuning network to an input/output terminal 22. The other end of the winding 16 is grounded and the other end of the winding 18 is connected through the section 12 of the tuning network to an input/output terminal 24.

With continued reference to FIG. 1, the section 14 may take the form of a series inductor 26 and shunt capacitor 28 to form a low pass section. The section 12 may take the form of a series capacitor 30 associated with the apparent shunt inductance 32 which results from the close coupling of the windings 16 and 18 as earlier indicated to form a high pass section.

Figure 2:
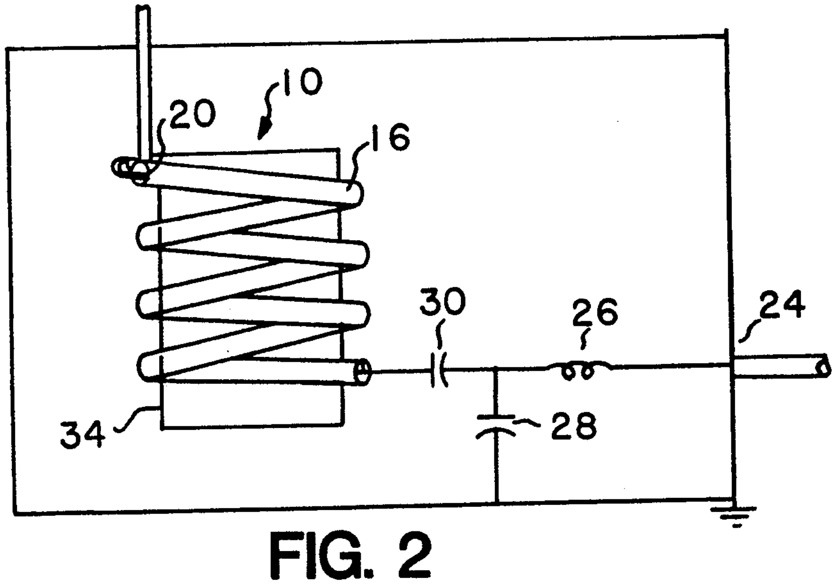
FIG. 2 is a pictorial representation of the physical arrangement of a second embodiment of the present invention.
Figure 3:
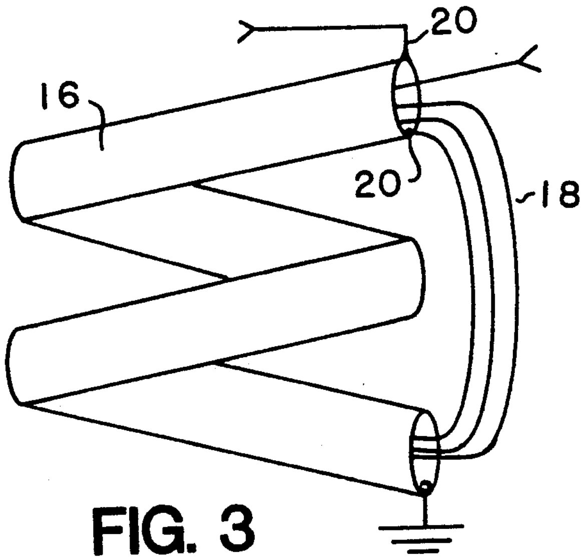
FIG. 3 is a pictorial representation of an integer ratio series connected transformer with 1:N turns ratio.

The winding 16 of the transformer 10 may take the form of a coiled tube as shown in FIGS. 2 and 3. It has been found convenient to use copper tubing between ⅜ and ⅝ inch diameter and to wind from 3 to 5 turns about a mandrel 34 having a diameter of approximately two inches. The mandrel 34 may thereafter be removed, or retained as part of the non-electrical physical supporting structure for the transformer.

The winding 18 may comprise a single wire, e.g., No. 10 or 12, which is threaded through the tube 16 before it is formed into the winding 16. The winding 18 must be insulated from the winding 16 and a Teflon® synthetic resin polymer coating has been found sufficient for this purpose.

Because the current carrying capacity of the wire 18 is a function of the diameter thereof, and because the stiffness of the winding 18 (and thus the difficulty in forming the coil) increases with diameter, it has been found convenient to use multiple strands of wire in parallel as the winding 16.

Because the two windings 16 and 18 are wound together, the turns ratio is an integer. Because the tap 20 is effecting the center tap of a single winding comprising windings 16 and 18 in series, the turns ratio of the transformer of FIGS. 1 and 2 is 1:2.

Where a different integer turns ratio is desired, the winding 18 may be passed through the tube 16 several times as shown in FIG. 3 where the turns ratio shown is 1:4.

As earlier indicated, the apparent inductance 32 of FIG. 1 results from the close coupling of the two windings 16 and 18 and is used as part of the high pass section 12. While the high pass section 12 is shown in FIG. 1 adjacent the terminal 24 with the low pass section 14 adjacent the terminal 22, the position thereof may be reversed, or alternatively both sections may be physically located on one side of the transformer as shown in FIG. 2.

In operation, the transformer of FIG. 1 has an alternating current input signal at a first input/output terminal 22. It is desired to match the impedance of this signal to that of the apparent load at a second input/output terminal 24.

The alternating current voltage that is applied to the coiled tube 16 passes through the low pass section 14 in the example of FIG. 1 before reaching the common tap 20. This section filters out high frequency harmonics and interacts with the transformer windings to change the integer turns ratio to a non-integer ratio for the low end of transformer's pass band.

The input voltage induces a sinusoidally varying magnetic flux in the coiled tube winding 16 having the same frequency as the input signal. The flux in the coiled tube winding 16 induces a voltage in the insulated wire winding 18 that has the same frequency as the voltage of the signal applied to the tube 16. As is well known, the magnitude of the voltage induced in the winding 18 is related to the magnitude of the input voltage by the ratio of the number of turns on the winding 18 to those on the winding 16.

The induced voltage in the wire winding 18 combines with that from the common tap 20 to produce an apparent inductance 32. Acting together with a series capacitor 30, this inductance forms the high pass section 12 of the tuning network. It suppresses low frequency harmonic components in the signal and affects the transformer windings so that their integer ratio is converted to a non-integer one at the high end of the transformer's pass band.

EXAMPLE NO. 1 (2–9 MHz)

Figure 4:
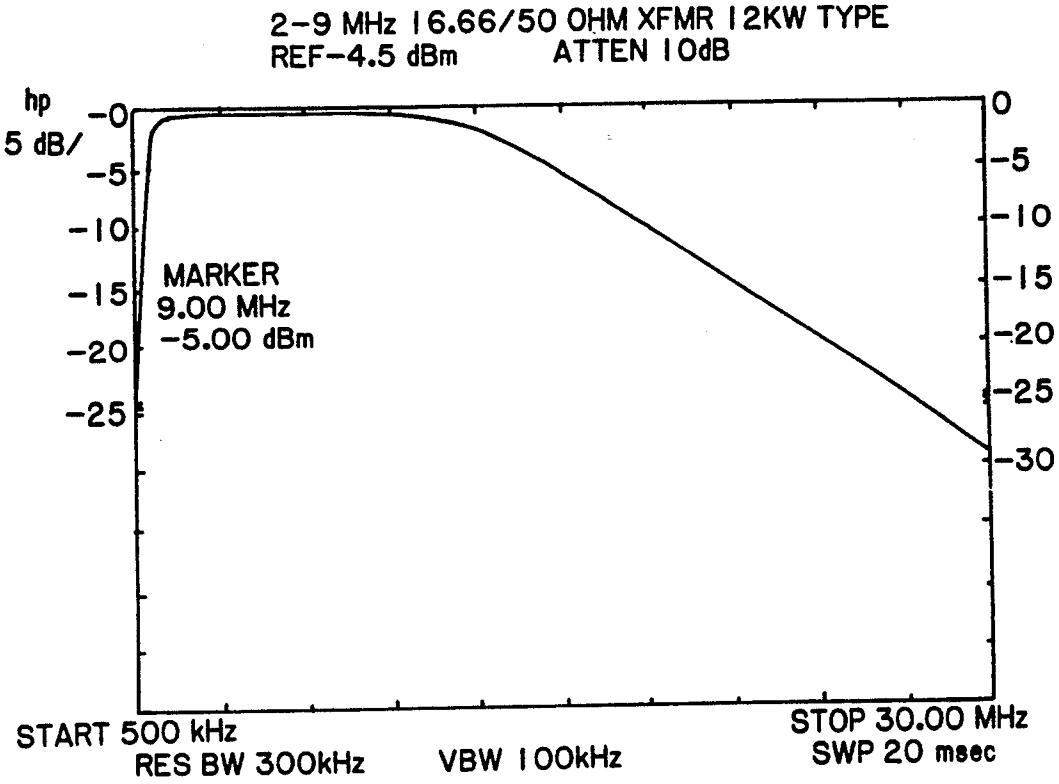
FIG. 4 is a graph of the attenuation characteristics of a 2–9 MHz embodiment of the present invention showing the passband.

A transformer was constructed with an input impedance of 16.66 ohms and the output impedance of 50 ohms. The coiled tube winding was 5/16 inch copper tubing wound on a two inch mandril and the wire winding was #10 gage teflon coated copper wire which produced an apparent shunt inductance of 8.4 μh. A series capacitor of 2,500 pf was added to complete the high pass section of its tuning network. The low pass section comprised a 0.8 μh coil and a shunt capacitor of 275 pf. As shown in FIG. 4, the out-of-band attenuation for the transformer of the third order harmonics of a 9 MHz marker signal was 24 db. Demonstrated power handling capability of this transformer was 12 kw average power.

EXAMPLE NO. 2 (9–30 MHz)

Figure 5:
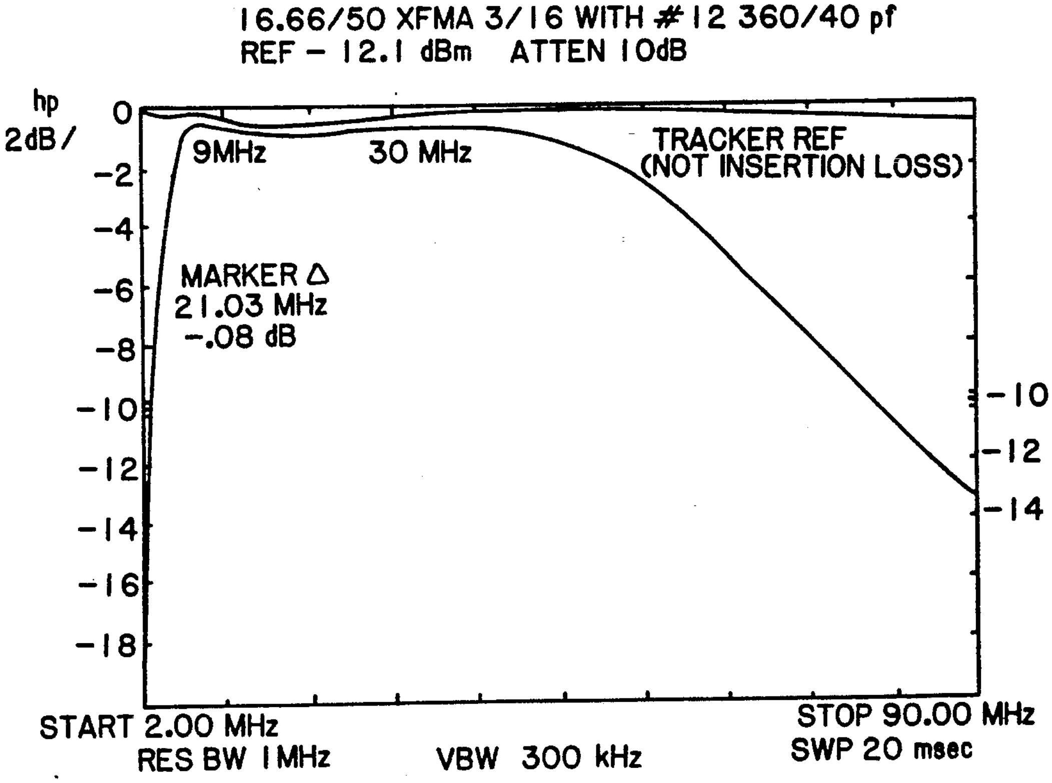
FIG. 5 is a graph of the attenuation characteristics of a 9–30 MHz embodiment of the present invention showing the passband.

A transformer was constructed with an input impedance of 16.66 ohms and an output impedance of 50 ohms. The coiled tube winding was 3/16 inch copper tubing wound on a 1¼ inch PVC mandril and the insulated wire winding was 12 gage Teflon® synthetic resin polymer coated copper wire which produced a shunt inductance of approximately 2 μh. A 360 pf series capacitor was added to complete the high pass section of its tuning network. The low pass section comprised a 0.2 μh inductance coil and a shunt capacitor of 40 pf. As shown in FIG. 5, the attenuation of the third order harmonics of a 30 MHz signal at 90 MHz was about 13.5 db. This transformer demonstrated a 12 kw power handling capability.

ADVANTAGES AND SCOPE OF INVENTION

As readily seen from the foregoing, the autotransformer of the present invention has an air core which obviates many of the problems associated with the use of magnetic cores such as ferrite.

The reduction in size, weight and cost is significant, as is the reduced susceptibility to shock and vibration.

The absence of ferrite at high power is particularly significant because the cooling system may be eliminated even at high power, and because of reduced system harmonic filtering.

The utilization of the apparent inductance as part of the tuning network results in a simple mechanical construction for a non-integer turns ratio transformation.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A high power, high frequency, air core, non-integer turns ratio transformer comprising:

first and second input/output terminals;

an electrically conductive coiled tube connected at one end to ground reference and at the other end to said first input/output terminal;

an insulated electrically conductive wire disposed internally of said coiled tube so as to have an integer turns ratio between said coiled tube and said wire and so as to create an apparent inductance, said wire being connected at one end to the other end of said coiled tube and at the other end to said second input/output terminal; and tuning means connected between said input/output terminals, said tuning means comprising with said apparent inductance both a high pass section and a low pass section to thereby modify the integer turns ratio of the transformer to a non-integer turns ratio.

2. The transformer of claim 1 wherein said tuning means is connected between the other end of said wire and said second input/output terminal.

3. The transformer of claim 1 wherein said tuning means is connected between the other end of said coiled tube and said first input/output terminal.

4. The transformer of claim 1 wherein a first portion of said tuning means is connected between the other end of said wire and said second input/output terminal; and wherein the remainder of said tuning means is connected between the other end of said coiled tube and said first input/output terminal.

5. The transformer of claim 1 wherein said wire is a single strand to thereby provide a integer turns ratio of 2:1 with said coiled tube.

6. The transformer of claim 5 wherein said wire comprises N parallel strands to thereby provide additional current carrying capacity.

7. The transformer of claim 1 wherein said insulated wire comprises N turns through said coiled tube to thereby provide a turns ratio of N+1:1 with said coiled tube.

8. The transformer of claim 1 wherein said coiled tube and said insulated wire form a coaxial transmission line.

9. The transformer of claim 1 wherein said coiled tube comprises a copper tube having a diameter of between about 0.25 and 0.5 inches formed into a two to five turn helix with an internal diameter of between about 1.5 and 3.0 inches; and wherein said insulated wire comprises a synthetic resin polymer coated copper wire having a diameter between about 1/16 and 3/16 inches.

10. The method of transforming impedance with a non-integer turns ratio comprising the steps of:

(a) transforming impedance with a closely coupled, integer turns ratio transformer; and (b) modifying the integer turns ratio by electrically tuning the apparent inductance of the transformer.

11. The method of claim 10 wherein the non-integer turns ratio is selectively modified by the step of selectively varying the tuning of the apparent inductance.

12. The method of claim 10 wherein the modification is accomplished by connecting a high pass and a low pass section in series with the transformer.

13. A high power, high frequency, air core, bandpass auto-transformer comprising:

first and second input/output terminals;

an electrically conductive coiled tube connected between ground reference and said first input/output terminal;

an insulated, electrically conductive insulated wire disposed internally of said coiled tube to create an apparent inductance due to the close coupling thereof to said tube, said insulated wire being connected between said input/output terminals; and tuning means connected between said input/output terminals, said tuning means co-acting with the apparent inductance of said coiled tube and said insulated wire to define the bandpass of said transformer.

14. The transformer of claim 13 wherein the pass band of said transformer is at least two octaves at least 4 kw.

15. The transformer of claim 13 with frequency of bandpass over 1 MHz.

16. The transformer of claim 13 with a bandpass ratio of 5:1.

17. The method of transforming impedance across a bandpass of at least two octaves at a frequency of at least 1 MHz comprising the steps of:

(a) transforming impedance with a closely coupled auto-transformer; and (b) modifying the transformation by electrically tuning the apparent inductance of the transformer.

18. The method of claim 17 wherein the modification is accomplished by the steps of:

(a) connecting in series with the transformer a capacitor to form with the apparent inductance a high pass section; and (b) connecting in series a low pass section in series with the transformer.

19. A high power, high frequency, auto-transformer comprising:

an electrically conductive coiled tube connected at one end to one end of an electrically conductive insulated wire disposed internally thereof, said tube and said wire having the capacity of handling at least 5 kw of power at a frequency in excess of 1 MHz and at a temperature of 150 degrees C. for an indefinite period; and tuning means electrically connected to said tube and to said wire for reacting with the apparent inductance thereof to suppress harmonics and intermodulation products of a signal within the passband of the transformer.

20. A method of suppressing harmonics and intermodulation products with a high power, high frequency, bandpass auto-transformer comprising the steps of:

(a) transforming impedance with a closely coupled, integer turns ratio auto-transformer;

(b) modifying the turns ratio and suppressing harmonic and intermodulation by electrically tuning said auto-transformer with series connected high pass and low pass sections.

21. An auto-transformer with the capacity of handling at least 5 kw of power at a frequency of at least 1 MHz over a bandwidth of at least two octaves without a liquid cooling system comprising:

an electrically conductive coiled tube;

tuning means comprising an inductance coil and two capacitors;

an insulated electrically conductive wire; and non-magnetic core means for coupling flux between said coiled tube and said insulated wire.

22. The transformer of claim 21 wherein said tube is copper with a diameter of between about 0.25 to about 0.5 inches formed into a two to five turn helix with an internal diameter of between about 1.5 and 3 inches;

wherein said wire is a synthetic resin polymer coated copper wire having a diameter between about $\frac{1}{8}$ inch to about $\frac{3}{8}$ inch diameter and is disposed internally of said coiled tube; and wherein said tuning means is electrically connected to one end of said wire and disposed in close physical proximity to said tube.

* * * * *